US011056522B2

United States Patent
Bradley, Jr. et al.

(10) Patent No.: US 11,056,522 B2
(45) Date of Patent: Jul. 6, 2021

(54) OPTICAL SENSOR ASSEMBLY

(71) Applicant: VIAVI SOLUTIONS INC., San Jose, CA (US)

(72) Inventors: Richard Alan Bradley, Jr., Santa Rosa, CA (US); Karen Denise Hendrix, Santa Rosa, CA (US); Jeffrey James Kuna, San Francisco, CA (US); Georg J. Ockenfuss, Santa Rosa, CA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 2 days.

(21) Appl. No.: 16/240,560

(22) Filed: Jan. 4, 2019

(65) Prior Publication Data
US 2019/0165024 A1 May 30, 2019

Related U.S. Application Data

(63) Continuation of application No. 14/942,940, filed on Nov. 16, 2015, now abandoned.
(Continued)

(51) Int. Cl.
*H01L 27/146* (2006.01)
(52) U.S. Cl.
CPC .............. *H01L 27/14625* (2013.01)
(58) Field of Classification Search
CPC ........... H01L 27/1462; H01L 27/14623; H01L 27/14625; H01L 31/02162–02165; H01L 31/02168; H01L 31/02327
See application file for complete search history.

(56) References Cited

U.S. PATENT DOCUMENTS 5,736,756 A * 4/1998 Wakayama ....... H01L 27/14831
257/223
6,545,329 B1 4/2003 Lannon, Jr. et al.
(Continued)

OTHER PUBLICATIONS

Kitamura et al. Optical constants of silica glass from extreme ultraviolet to far infrared at near room temperature. Nov. 19, 2007. Applied Optics. vol. 46, No. 33. pp. 8118-8133. (Year: 2007).*
(Continued)

*Primary Examiner* — Hoang-Quan Ho
(74) *Attorney, Agent, or Firm* — Mannava & Kang, P.C.

(57) ABSTRACT

An optical sensor assembly is provided in which a dark mirror coating is used to suppress stray light in the form of both unwanted reflections from non-optically active regions of the sensor assembly surface and unwanted transmission of light into the surface region of the sensor assembly. The sensor assembly includes an image sensor positioned in a substrate adjacent to substrate surface areas that are not optically active. A dark mirror coating covering those surface areas significantly reduces reflections from non-optically active surface regions and improves image sensor performance in terms of signal-to-noise ratio and reduction in the appearance of "ghost" images, in turn enhancing the accuracy and precision of the sensor. The dark mirror coating may in the alternative, or in addition, be positioned underneath an optical filter, depending on the structure, material, and requirements of a particular sensor assembly.

17 Claims, 6 Drawing Sheets

Related U.S. Application Data

(60) Provisional application No. 62/079,684, filed on Nov. 14, 2014.

(56) References Cited

U.S. PATENT DOCUMENTS

| | | |
|---|---|---|
| 6,587,288 B2 | 7/2003 | Erz et al. |
| 2002/0176183 A1 | 11/2002 | Erz et al. |
| 2006/0138485 A1 | 6/2006 | Jung |
| 2006/0220025 A1* | 10/2006 | Oh .................... H01L 27/14609 257/72 |
| 2008/0042066 A1 | 2/2008 | He et al. |
| 2008/0230861 A1* | 9/2008 | Li .................... H01L 27/14623 257/435 |
| 2009/0017575 A1 | 1/2009 | Knudsen et al. |
| 2009/0032841 A1 | 2/2009 | Eller et al. |

OTHER PUBLICATIONS

Definition of alloy. Merriam-Websiter. Online, retrieved on Oct. 29, 2017, 1 page. https://www.merriam-webster.com/dictionary/alloy.
Kitamura et al., "Optical constants of silica glass from extreme ultraviolet to far infrared at near room temperature", Nov. 20, 2007, Applied Optics. vol. 46, No. 33. pp. 8118-8133.

* cited by examiner

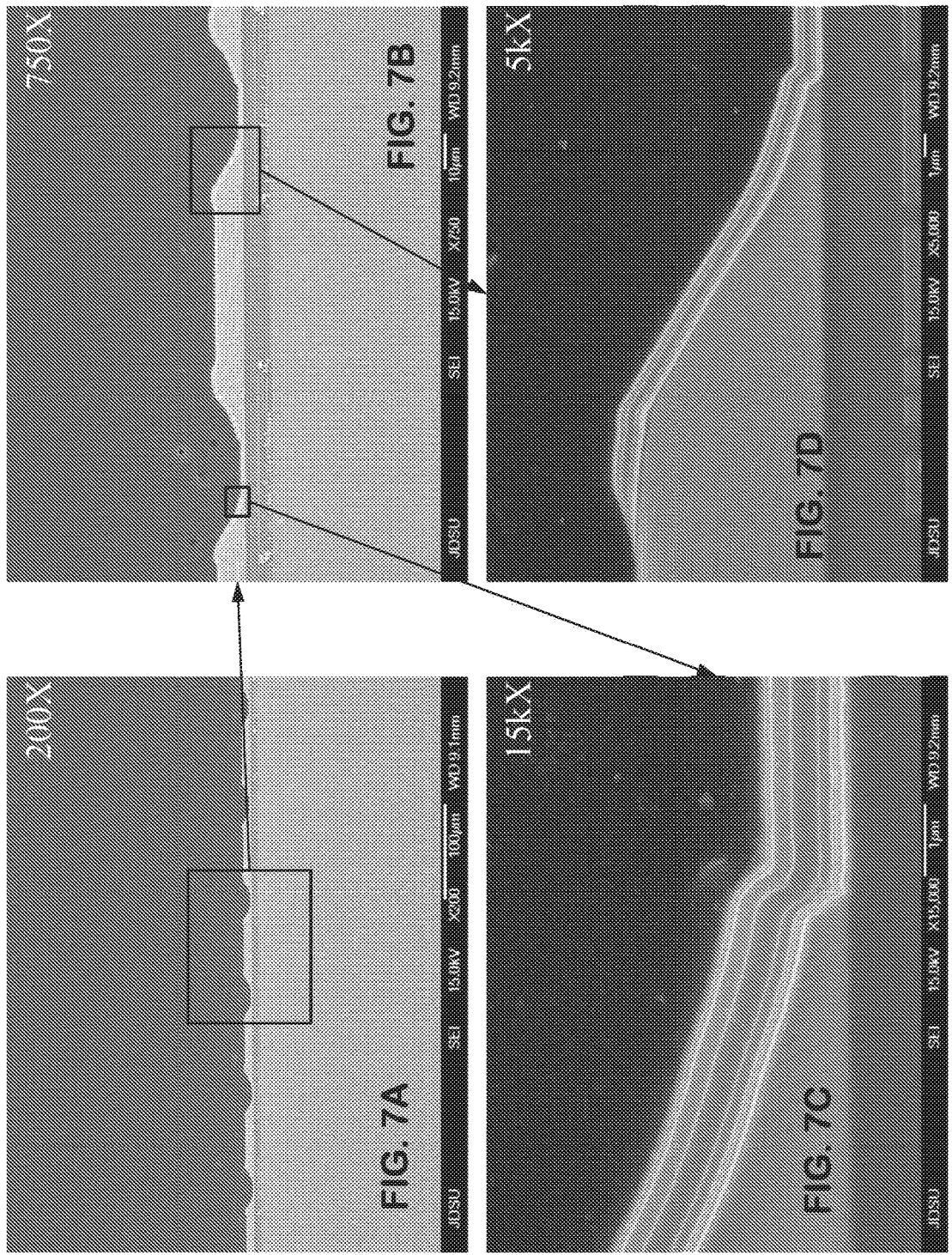
FIG. 7: LWP Filter with Dark Mirror Aperture

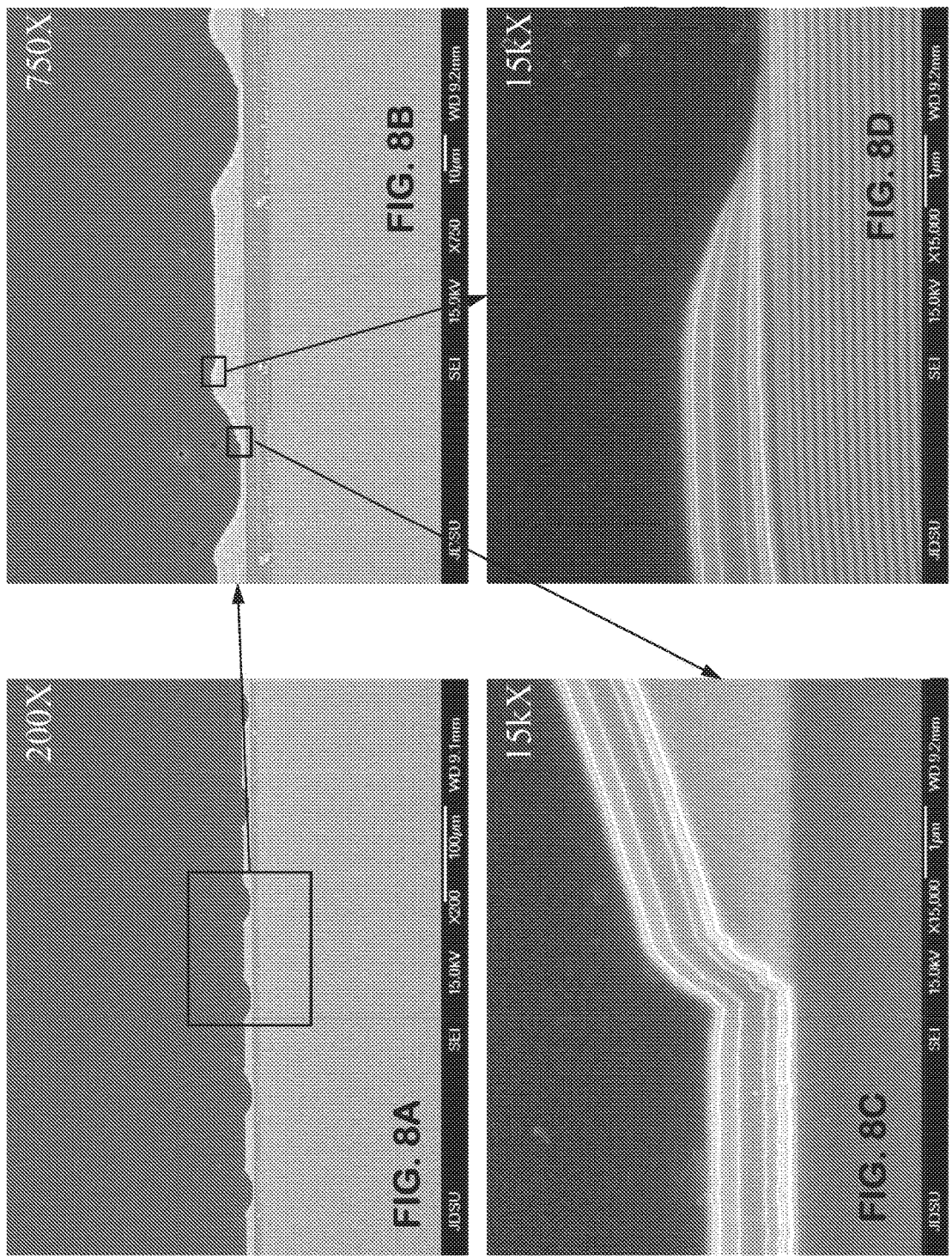
FIG. 8: LWP Filter with Dark Mirror Aperture

OPTICAL SENSOR ASSEMBLY

CROSS-REFERENCE TO RELATED APPLICATION

This application is a continuation of U.S. application Ser. No. 14/942,940, filed Nov. 16, 2015, which claims priority under 35 U.S.C. § 119(e)(1) to provisional U.S. Patent Application Ser. 62/079,684, filed Nov. 14, 2014, the disclosure of which is hereby incorporated by reference herein.

TECHNICAL FIELD

The present invention relates generally to optical sensors, and, more particularly to optical sensor assemblies and methods for suppressing stray light in optical sensor assemblies, including both unwanted reflection and unwanted transmission.

BACKGROUND

The exposed surface of an optical sensor chip includes regions that are optically active, i.e., optically sensitive, as well as regions that are not optically active ("non-active areas"). Ideally, the optical path directs light only to the optically active surface regions of the sensor chip. The geometry of the sensor, however, is often dictated by electronics rather than optics. Thus, in many instances, a significant portion of the incoming light in the optical path falls onto non-active areas. The surface reflectance from non-active areas is typically uncontrolled, and therefore these areas can reflect light back into the optical system. The reflected light can be inadvertently collected by the sensor, creating noise in the sensed optical signal and resulting in ghost reflections and scatter. Typically, these non-active areas are coated with layers of oxides and nitrides, as well as layers of metals, and the reflectance of these materials can be substantial, on the order of 50% or even higher. The ratio of signal to noise is, of course, an important attribute of any sensor, and the signal-to-noise ratio should be maximized to provide an optimal system. Suppressing reflections from non-optically active surfaces would produce higher quality images, because ghost reflections are lessened.

Anti-reflective or anti-reflection ("AR") coatings are known in the art as coatings that can be applied to a substrate surface to reduce the reflectance of the surface or of a region on the surface. The earliest and simplest AR coatings involved refractive index matching wherein the refractive index of the selected coating would fall between the refractive index of the underlying substrate and the refractive index of the external medium, in turn reducing reflection at the coating-external medium and coating-substrate interfaces. More recently developed AR coatings involve single-layer or multi-layer interference systems; while these coatings are more versatile, the optical properties of the underlying substrate must still be taken into account in their construction. The use of conventional AR coatings is, therefore, generally limited to substrates having consistent optical properties across the substrate surface. There is, accordingly, an ongoing need in the art for technology that substantially reduces unwanted reflections from non-optically active areas on optical sensor chips in which optical properties vary across the substrate surface. An ideal such method would also enable prevention of light transmission into one or more surface regions of the substrate.

SUMMARY OF THE INVENTION

Accordingly, the invention is directed to the aforementioned need in the art and provides a system for minimizing reflections from non-optically active regions of a substrate surface, i.e., a substrate surface on which there is at least one optical property that varies across that surface. The system is generally in the form of an optical sensor assembly comprising:

a substrate having a surface;

an optical image sensor at the substrate surface having an aperture for detecting and receiving light and providing a signal in response thereto, wherein the aperture defines an optically active surface region, with the remainder of the substrate surface defining a non-optically active surface region;

a dark mirror coating disposed over at least a portion of the substrate surface but not substantially in the region of the aperture, wherein the dark mirror coating is configured as an absorptive anti-reflective coating to reduce reflections from the non-optically active surface region and to reduce transmission through the non-optically active surface region and into the substrate, and comprises an initial absorbing layer provided on the substrate surface and an outwardly facing dielectric layer on the initial absorbing layer.

The reduction in stray light is achieved by virtue of the fact that the dark mirror coating both reduces unwanted reflections from non-optically active surface regions and reduces unwanted transmission of light through those regions and into the substrate.

In another embodiment, an optical sensor assembly is provided as above in which an optical thin film filter is disposed over the optical image sensor. The thin film filter is configured to filter light so that only light in a selected wavelength range passes through the filter and reaches the sensor. The dark mirror coating may be disposed under the optical thin film filter or over the thin film filter and form an aperture. In a variation on this embodiment, there are two dark mirror coatings, one disposed under the optical thin film filter and the other over the thin film filter. The configuration of the optical sensor assembly in this regard, i.e., with respect to the positioning of the dark mirror coating, will depend on the structure, materials, and requirements of a particular sensor assembly.

In an additional embodiment, the optical sensor assembly of the invention is provided with two or more optical sensors at the substrate surface, each having an aperture for detecting and receiving light and providing a signal in response thereto.

Another embodiment of the invention pertains to an optical sensor assembly in which the dark mirror coating comprises at least one pair of a light absorbing layer and a substantially non-absorbing layer, such that in some cases the dark mirror coating will comprise a stack of alternating absorbing and substantially non-absorbing layers. In this embodiment, the optical sensor assembly comprises:

a substrate having a surface;

an optical image sensor at the substrate surface having an aperture for detecting and receiving light and providing a signal in response thereto, wherein the aperture defines an optically active surface region, with the remainder of the substrate surface defining a non-optically active surface region;

a dark mirror coating disposed over at least a portion of the substrate surface but not substantially in the region of the aperture, wherein the dark mirror coating is configured as an absorptive anti-reflective coating to reduce reflections from the non-optically active surface region and to reduce transmission through the non-optically active surface region and into the substrate, and further wherein the dark mirror coating comprises a first pair of layers provided on the substrate surface, the first pair of layers including a first substantially non-absorbing layer disposed directly on the substrate surface and a first absorbing layer adjacent to and overlying the first substantially non-absorbing layer, optionally at least one additional pair of layers including a substantially non-absorbing layer and an absorbing layer configured such that the absorbing layers and the substantially non-absorbing layers alternate, and an outwardly facing dielectric layer serving as the surface of the dark mirror coating.

Any one absorbing layer may actually be comprised of two or more individual absorbing layers, or "sublayers," and, similarly, any one substantially non-absorbing layer may be comprised of two or more individual substantially non-absorbing sublayers. Further, different absorbing materials may be selected for each of the absorbing layers in an optical sensor assembly that comprises two or more absorbing layers; it is not essential that each absorbing layer be composed of a material identical to that used for all other absorbing layer. The same is true for the substantially non-absorbing layers, i.e., different substantially non-absorbing materials may or may not be selected for each of the substantially non-absorbing layers in an optical sensor assembly that comprises two or more substantially non-absorbing layers.

Additional objects, advantages, aspects, and novel features of the invention will be set forth in part in the description which follows, and in part will become apparent to those skilled in the art upon examination of the following, or may be learned by practice of the invention.

BRIEF DESCRIPTION OF THE DRAWINGS

FIGS. 7A through 7D (collectively FIG. 7) are cross-sectional scanning electron microscope (SEM) photos of an optical sensor assembly of the invention. The optical image sensors are photodiodes, shown in FIG. 7A (at 200×), with two image sensors shown in FIG. 7B at a higher magnification (700×). Two regions are identified in FIG. 7B that are focused on at higher magnification in FIGS. 7C and 7D (both at 15 k×). The dark mirror coating is shown disposed over a surface defect (FIG. 7C) and over a tapered region of an optical thin film filter (FIG. 7D).

FIGS. 8A through 8D (collectively FIG. 8) are additional cross-sectional SEM photos of the optical sensor assembly in which two different regions of the substrate surface are identified for enlarging at 15 k×, with FIG. 8C illustrating the dark mirror coating disposed over a surface defect in the form of a "foot," and FIG. 8D illustrating the dark mirror coating tapering over the optical thin film filter.

DETAILED DESCRIPTION OF THE INVENTION

Figure 1:
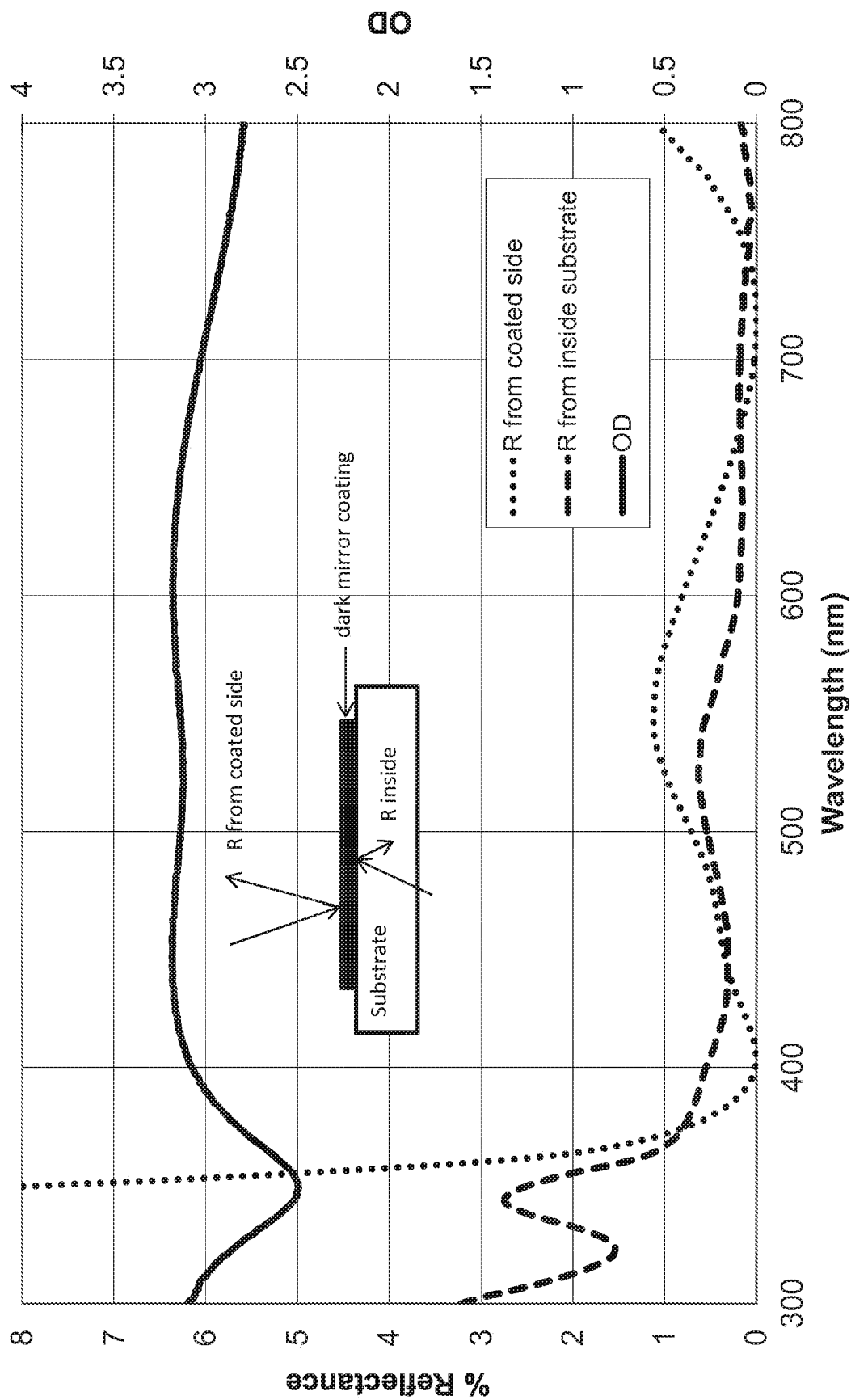
FIG. 1 is a visible light reflectance spectrum at near normal incidence of a dark mirror coating of the invention, and indicates the percent reflectance from the coated side of the substrate, the percent reflectance from inside the substrate, and the optical density.

Unless defined otherwise, all technical and scientific terms used herein have the meaning commonly understood by one of ordinary skill in the art to which the invention pertains. Specific terminology of particular importance to the description of the present invention is defined below.

In this specification and the appended claims, the singular forms "a," "an" and "the" include plural referents unless the context clearly dictates otherwise. Thus, for example, "an absorbing layer" refers not only a single layer but also to a combination of two or more absorbing layers, "an absorbing material" refers to a single absorbing materials as well as to a combination (e.g., mixture) of two or more absorbing materials, a "gray metal" refers to a single gray metal or to a mixture of different gray metals, and the like.

By "absorbing" as that term is used herein to describe certain layers and materials is meant that a particular layer or material exhibits an absorbance of greater than about 0.4, typically greater than about 0.6, and more typically greater than about 0.7 (which in terms of percent transmittance, or % T, corresponds to an approximate % T of less than 40%, more typically less than 25%, and most typically less than 20%) at a particular wavelength or within a particular wavelength range.

By "substantially non-absorbing" as that term is used herein to describe certain layers and materials is meant that a particular layer or material exhibits an absorbance of less than about 0.2, typically less than about 0.13, most typically less than about 0.1 (which, again, in terms of percent transmittance, corresponds to an approximate % T of greater than 60%, typically greater than 75%, and more typically greater than about 80%) at a particular wavelength or within a particular wavelength range.

The term "external medium" is used in conjunction with the description of a coated substrate in which the coating lies between the substrate and the "external medium," which may be, for instance, air, water, oil, epoxy, or any number of other materials.

As noted above, the invention in one aspect provides an optical sensor assembly in which reflections from non-optically active regions of a substrate surface as well as light transmission through the non-optically active regions into the substrate are both minimized. The invention is effective in this regard even in the instance where at least one optical property varies across the substrate surface. By "optical property" is meant a property relating to the interaction of the surface material with light. By "at least one optical property" is generally meant at least one of absorption, transmission, reflection, and scatter.

For instance, tapered regions of a coating or layer, such as an optical thin film filter, can cause optical properties to vary in the location of the taper. As another example, a drop in the height of a layer or series of layers (such as in a "foot" defect") can cause optical properties to vary in that location. By appropriate placement of a dark mirror coating as described infra, unwanted reflection from non-optically active surface regions can be eliminated or at least significantly reduced, even in those instances wherein optical properties vary across the substrate surface as just described. Placement of a dark mirror coating as provided herein simultaneously reduces light transmission through the non-optically active surface regions into the substrate. This is an important consideration as well, for example in preventing light from reaching the electronic circuitry associated with the image sensor and being converted to an unwanted electronic signal, and in preventing light for transmitting into an underlying optical filter structure.

The optical sensor assembly of the invention includes a substrate housing an optical image sensor and associated electronic circuitry. The optical image sensor has an aperture for detecting and receiving light and provides an optical signal in response thereto, wherein the aperture defines an optically active surface region, with the remainder of the substrate surface defining a non-optically active surface region. When the optical sensor assembly contains two or more optical image sensors, it is to be understood that each aperture defines an optically active surface region, with the remainder of the substrate surface defining a non-optically active surface region.

The optical sensor may comprise any type of optical image sensor suited to a particular application, including a single-channel discrete detector or a photodetector array-type sensor (for example linear 1-D or areal 2-D array), wherein the photodetectors may be photodiodes, phototransistors, or the like. Generally, the optical sensor is a CCD (charge coupled device) or CMOS (complementary metal oxide semiconductor) image sensor, both of which, as is well known in the art, depend on the photoelectric effect to create an electronic signal from light. In a CCD, an image is projected through a lens onto the optically active region, which, in the case of the CCD, is a capacitor array, in turn causing each capacitor to accumulate an electrical charge proportional to the intensity of light at that location. The associated electronic control circuitry causes a cascade of charge transfer ultimately directed into a charge amplifier, which then converts the charge into a voltage. Repetition of the process results in conversion of the entire contents of the capacitor array to a sequence of voltages. In a digital device, these voltages are then sampled, digitized, and usually stored in memory; in an analog device (such as an analog video camera), they are processed into a continuous analog signal (e.g. by feeding the output of the charge amplifier into a low-pass filter), which is then processed and fed out to other circuits for transmission, recording, or other processing. In a CMOS sensor, each pixel within the optically active region undergoes its own charge-to-voltage conversion, a massively parallel process that provides for high speed imaging and a higher signal-to-noise ratio. Front and back illuminated sensors are also useful in conjunction with the present invention.

A variety of different materials are utilized in the manufacture of sensors, each of which has its own surface properties and reflectance. A non-limiting list of sensor materials includes silicon, germanium, indium gallium arsenide (InGaAs), platinum silicide (PtSi), mercury cadmium telluride (MCT, HgCdTe), lead sulfide (PbS), indium antimonide (InSb), mercury zinc telluride (MZT, HgZnTe), lead selenide (PbSe), lithium tantalate (LiTaO3), indium antimonide (InSb), triglycine sulfate (TGS and DTGS), vanadium pentoxide, and indium arsenide (InAs).

The coatings used in connection with the present invention are "dark mirror" coatings, i.e., coatings that reduce both reflection and transmission and are thus absorptive anti-reflective (AAR) coatings. These coatings are configured to reduce reflection and transmission of light in a specific spectral bandwidth, e.g., a wavelength range within the visible light spectrum, a wavelength range within the near-infrared (near-IR) or IR spectrum, and the like. In some instances, the dark mirror coating is deposited directly on the sensor material (such as silicon, as would be the case for a back illuminated sensor). In other instances, the dark mirror coating can be deposited onto an oxide or nitride layer that has been previously deposited or formed on the surface of the sensor material (for example SiOx or SiNx). In still other instances, the dark mirror coating can be deposited onto a single or multi-layer optical coating or optical filter. In each case, the dark mirror affects the spectral reflectance and transmittance of the previously uncoated non-optically active surface.

The absorbing, anti-reflective dark mirror coating is designed to provide the optimum suppression of unwanted reflections from non-optically active areas on the surface of the optical sensor assembly as well as unwanted transmission through those non-optically active areas into the substrate. As will be understood by those of ordinary skill in the art, the dark mirror can be optimized to suppress reflection and transmission over a narrow wavelength range or a more broad range of wavelengths, depending on the electromagnetic radiation that the sensor is capable of detecting and receiving. A visible light sensor may be paired with a dark mirror designed to suppress wavelengths near the visible spectrum, for example in the range of about 300 nm to 800 nm. A red-green-blue (RGB) light sensor may be paired with a dark mirror designed to suppress wavelengths in both the visible and near-infrared spectral regions, for example in the range of about 300 nm to 2500 nm. An ultraviolet sensor may be paired with a dark mirror designed to suppress wavelengths near the ultraviolet, for example in the range of about 100 nm to 450 nm. A near-infrared sensor may be paired with a dark mirror customized to suppress near-infrared wavelengths, for example in the range of about 700 nm to 2500 nm. Dark mirrors can be designed for use with mid-infrared sensors by suppressing reflections at wavelengths up to approximately 7 micrometers. Dark mirrors can be designed for use with far-infrared sensors by suppressing reflections at wavelengths up to at least about 11 μm.

The dark mirror can also be optimized to suppress reflection and transmission over a range of incident light angles using techniques and/or technology that is commercially available and/or known to those of ordinary skill in the art. Commercially available optimization software may be advantageously employed in this context, and include various products available from OptiLayer GmbH as well as TFCalc from Software Spectra, Inc. (Portland Oreg.). It is generally desired that the dark mirror be able to suppress reflections over a broad range of incident angles, to avoid direct and/or scattered light from causing an increased amount of noise in the sensor signal(s).

Absorbing anti-reflecting dark mirror coatings of the present invention operate under the principles of constructive and destructive interference of electromagnetic waves. For this reason, the layers of coating material should have interfaces that are approximately parallel to each other over the scale of the relevant wavelength range. Dark mirror coatings and manufacture thereof have been described. See, e.g., U.S. Pat. No. 4,898,435 to Jungkman et al., U.S. Pat. No. 5,808,714 to Rowlands et al., and U.S. Patent Publication No. 2004/0247906 A1 to Gasloli. Reference may also be had to Philip W. Baumeister, Optical Coating Technology (Bellingham, Wash.: SPIE—The International Society for Optical Engineering, 2004), in Chapter 8, and to *Physics of Thin Films: Advances in Research and Development*, Eds. George Haas et al. (New York: Academic Press, Inc., 1982). The pertinent sections of the foregoing patent documents and text are incorporated by reference herein in their entireties.

In a first embodiment, the dark mirror coating used in conjunction with the present invention is composed of an initial absorbing layer on the substrate surface and an outwardly facing dielectric layer disposed thereon. In context, this embodiment provides an optical sensor assembly that includes the aforementioned substrate, i.e., an active device wafer surface, an optical image sensor at the substrate surface that has an aperture for detecting and receiving light and providing a signal in response thereto, where the aperture defines an optically active surface region, the remainder of the substrate surface defining a non-optically active surface region. The dark mirror coating is disposed over at least a portion of the substrate surface but not substantially in the region of the aperture, meaning that the coating blocks less than 20%, typically less than 10%, and optimally less than 5% of the aperture. The dark mirror coating, as noted earlier herein, is configured as an absorptive anti-reflective coating to reduce reflections from the non-optically active surface region and to reduce transmission through the non-optically active surface region into the substrate. In this embodiment, the dark mirror coating comprises the initial absorbing layer on the substrate surface with an outwardly facing dielectric layer disposed on the initial absorbing layer, the outwardly facing dielectric layer serving as the surface of the dark mirror coating. This embodiment of the optical sensor assembly with the dark mirror coating can be represented as follows:

Active device wafer surface/M/D-ext where M is the initial absorbing layer and D is the outwardly facing dielectric layer. The material selected for M is generally aluminum, a gray metal, or an alloy thereof, i.e., an alloy of two or more gray metals, an alloy of at least one gray metal and at least one other metal, an alloy of aluminum and at least one other metal that may or may not include a gray metal. Examples of gray metals useful herein include, without limitation, tantalum, niobium, titanium, nickel, chromium, silicon, and alloys thereof, particularly tantalum, niobium, and tantalum-niobium alloys such as $Ta_{80}Nb_{20}$, $Ta_{60}Nb_{40}$, $Ta_{40}Nb_{60}$, and $Ta_{20}Nb_{80}$. The dielectric surface layer is composed of a dielectric material or a combination or mixture of two or more dielectric materials, examples of which are provided infra. For optimal anti-reflective performance, the outermost dielectric layer should have a low refractive index. Selection of dielectric materials for use herein at a particular wavelength or within a particular wavelength range may also be carried out with reference to the $n(\lambda)$ and $k(\lambda)$ spectra of any candidate material.

Figure 2:
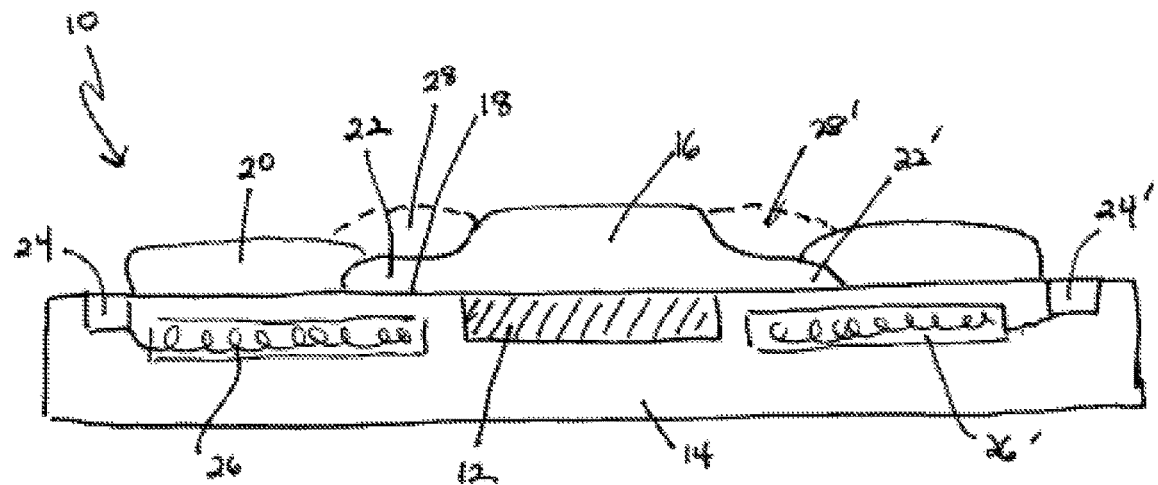
FIG. 2 is a schematic cross-sectional view of an optical sensor assembly of the invention, in which a dark mirror coating is provided on the non-optically active areas of the substrate surface, extending from a central optical thin film coating covering the image sensor to the bond pads.
Figures 2A, 2B:
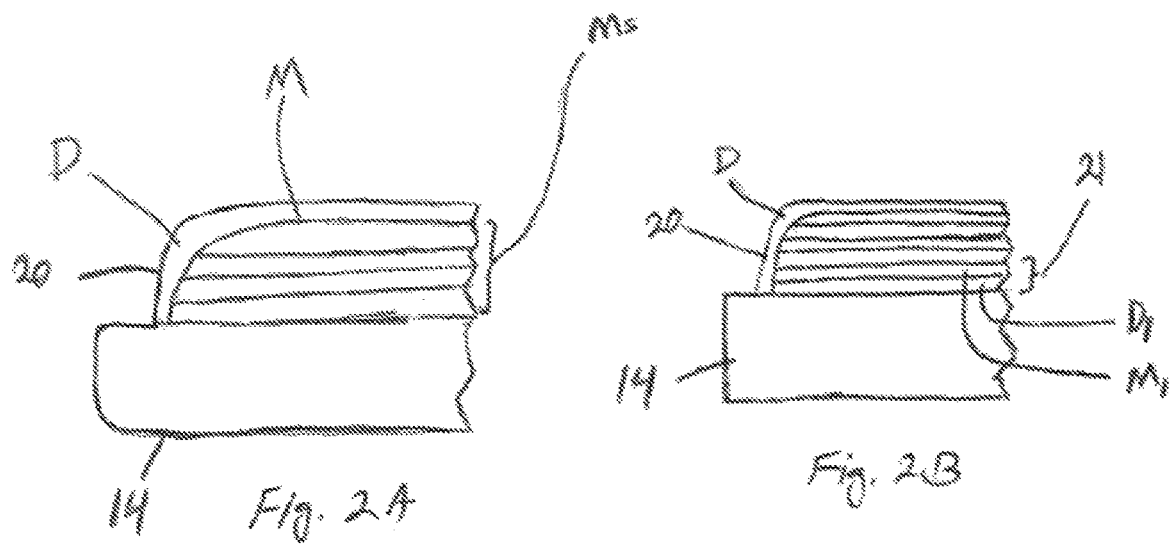
FIG. 2A is a magnified portion of FIG. 2 illustrating the dark mirror coating and the substrate, according to an example of the present disclosure.
FIG. 2B is an alternative magnified portion of FIG. 2 illustrating the dark mirror coating and the substrate, according to an example of the present disclosure.

As shown in FIG. 2A, the initial absorbing layer M may be composed of two or more distinct absorbing layers, or "sublayers," Ms such that a stack of absorbing sublayers essentially serves as a single absorbing layer. The sublayers within the layer may be composed of identical materials, similar materials, different materials, alternating materials, or randomly distributed materials. Analogously, the dielectric surface layer may be composed of two or more distinct dielectric sublayers, which, similarly, may be the same or different.

In another embodiment, as shown in FIG. 2B, the dark mirror coating includes a first pair of layers 21, i.e., a first absorbing layer and a first substantially non-absorbing layer, disposed on the substrate surface, with, again, an outwardly facing dielectric layer serving as the surface of the dark mirror coating. In this case, the first substantially non-absorbing layer is disposed directly on the substrate surface and the first absorbing layer is adjacent to and overlies the first substantially non-absorbing layer. This embodiment can be represented as follows:

Active device wafer surface/D1/M1/D-ext wherein D1 represents the first substantially non-absorbing layer, M1 represents the first absorbing layer, and D-ext represents the surface dielectric layer.

The "DM pair" can define a period of a multilayer structure in which the dark mirror coating is composed of two or more pairs of a substantially non-absorbing layer and an absorbing layer. That is, the dark mirror coating may contain, in addition to the first "DM" pair, at least one additional pair of layers each including a substantially non-absorbing layer and an absorbing layer configured so that the absorbing layers and the substantially non-absorbing layers alternate. One such embodiment may be represented as:

Active device wafer surface/D1/M1/D2/M2/D-ext where D1 and D2 are the substantially non-absorbing layers and M1 and M2 are the absorbing layers.

A two-period dark mirror coating of the invention can be represented as:

Active device wafer surface/D1/M1/D2/M2/D3/M3/D-ext where D1, D2, and D3 are the substantially non-absorbing layers and M1, M2, and M3 are the absorbing layers. It will be appreciated that dark mirror coatings with additional DM pairs can also be used in conjunction with the optical sensor assembly of the invention.

In the foregoing embodiments, each D1, D2, D3, etc. comprises a substantially non-absorbing material, e.g., a dielectric material, and can be composed of a single layer or two or more sublayers, where the sublayers, similarly, may be the same or different. Analogously, each M1, M2, M3, etc. comprises an absorbing material and can be composed of a single layer or two or more sublayers, where the sublayers, again, may be the same or different.

Examples of absorbing materials suitable for the absorbing layers in the embodiments wherein the dark mirror coating includes at least one "DM" pair are metallic materials, including aluminum, gray metals, and alloys thereof, as explained with respect to the initial absorbing layer M, and include, for purposes of illustration, tantalum, niobium, titanium, nickel, chromium, silicon, and alloys thereof, particularly tantalum, niobium, and tantalum-niobium alloys such as $Ta_{80}Nb_{20}$, $Ta_{60}Nb_{40}$, $Ta_{40}Nb_{60}$, and $Ta_{20}Nb_{80}$. Examples of substantially non-absorbing materials suitable for the substantially non-absorbing layers are dielectrics such as $SiO_2$, $Ta_2O_5$, $NbTaO_5$, $Nb_2O_5$, $TiO_2$, $NbTiO_x$, $Al_2O_3$, $Si_3N_4$, $Cr_2O_3$, $MoO_3$, and combinations thereof.

The material pairs, i.e., the DM pairs, can include, without limitation, alternating layers of metals and their oxides, such as silicon and silicon oxide; titanium and titanium oxide; tantalum and tantalum oxide; and chromium and chromium oxide.

When deposited onto the non-optically active surface regions of the present optical sensor assembly, the dark mirror coating can reduce the level of reflectance from uncoated values such as 9%, 23%, or 60% to the coated level of less than 1% (see FIG. 1). This reduction of reflectance by one or two orders of magnitude greatly suppresses the presence of ghost images and unwanted noise-generating light reaching the sensor from the non-sensor areas. By suppressing unwanted noise, the signal-to-noise ratio is increased, thereby increasing both the accuracy and precision of the sensor. The optical sensor assembly of the present invention provides for reflectance in a wavelength band of the optical signal that is less than about 10%, generally less than about 2%, more typically less than about 1%, and optimally less than about 0.5% of the optical signal itself, the reduction dependent in part on wavelength range and the particular design vis-à-vis relative positioning of aperture, optical filter, and dark mirror coating.

The geometry of the present optical sensor assembly can be important to its function. When dark mirror coatings are incorporated into the sensor geometry, their placement can be selected to improve the system performance while maintaining the desired functionalities of the sensor, as will be evident from the description, infra, regarding the optical sensor assemblies depicted in the figures. For example, in some instances it is desirable to coat the dark mirror across a patterned edge of an optical filter to prevent unwanted light from entering the filter at its edge, where it could scatter sideways and become trapped either in the optical filter or between the substrate and the filter surface, and eventually scattered towards the detector.

Dark mirror coatings can be deposited onto non-optically active areas of the surface of the optical sensor assembly using a variety of techniques. Non-limiting examples include physical vapor deposition, chemical vapor deposition, spin coating, reactive sputtering, or other techniques as will be recognized by those of ordinary skill in the art. Combinations of techniques may also be used.

Several well-known techniques such as photolithography and physical masking can be used to allow deposition of the dark mirror in selected areas, i.e., the non-optically active areas, while avoiding deposition in other areas.

FIG. 2 illustrates one embodiment of the invention in schematic cross-sectional view. The sensor assembly is shown generally at 10 with the image sensor 12 centrally positioned in substrate 14. Optical thin film filter 16 covers the surface of the sensor and extends outwardly, beyond the edges of the sensor, to overlie regions of the substrate surface 18 that are directly adjacent to the sensor. Dark mirror coating 20 extends from each tapering region 22 and 22' of the optical thin film filter to each bond pad 24 and 24', which serve as electrical connection points to the associated electronic circuitry (shown as 26 and 26', which may be in separate regions of the substrate, as shown, or combined and present in a single region of the substrate) and are thus in electrical communication therewith. The optical thin film filter covers the sensor and directly adjacent regions, as indicated. If the sensor is intended to measure wavelengths of green light, the optical thin film filter may function as a green filter; analogously, if the sensor is intended to measure wavelengths of red light, the optical thin film filter may function as a red filter. Optionally, the dark mirror can be made larger such that the outer regions of the optical thin film are physically covered by a portion 28 and 28' (i.e., the regions under the dotted lines shown in the figure) of the dark mirror. This is a desirable outcome in some instances, as the dark mirror in these cases can prevent light from leaking into the sensor from the edges of the optical thin film region. It is important that the distance between the perimeter of the dark mirror and the sensor perimeter be sufficient to prevent blocking of too great an area of the sensor by the dark mirror, as this would unnecessarily reduce the amount of light reaching the sensor and potentially degrade sensor performance.

Figure 3:
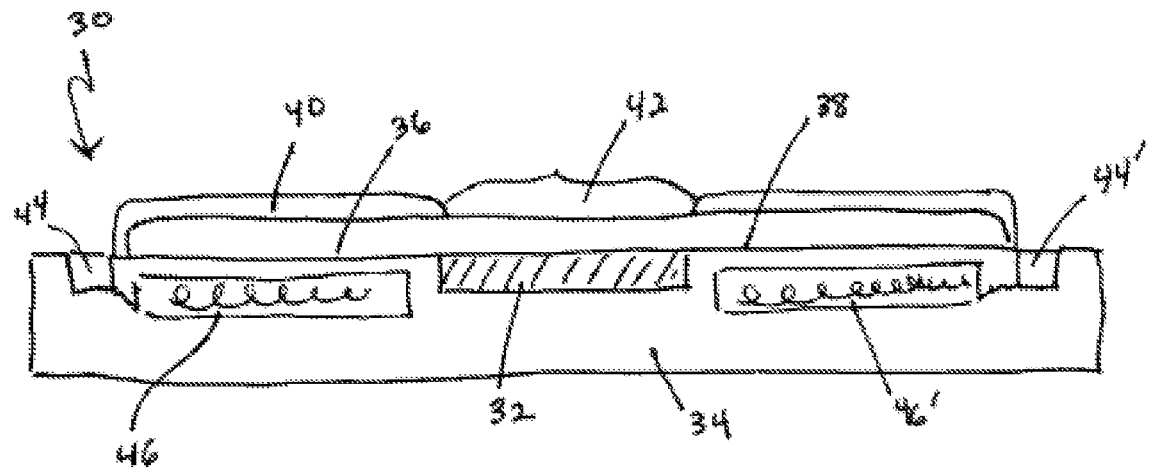
FIG. 3 is a schematic cross-sectional view of another embodiment of an optical sensor assembly of the invention, in which a dark mirror coating is provided on the non-optically active areas of the substrate surface over an optical thin film coating that covers the sensor and extends to the bond pads.

FIG. 3 illustrates another embodiment of the invention in schematic cross-sectional view, with the optical sensor assembly shown generally at 30. The image sensor 32 is again centrally positioned in substrate 34. In this embodiment, an optical thin film filter 36 covers both the sensor 32 and the non-optically active adjacent substrate surface regions 38. In this embodiment, the dark mirror coating 40 is applied to non-optically active areas adjacent to the sensor, overlying the optical thin film filter 36 except in the region of aperture 42 approximately vertically aligned with the image sensor. Dark mirror coating 40 extends from each edge of aperture 42 toward each bond pad 44 and 44', terminating in the region thereof; typically, the distance between the perimeter of the dark mirror and the bond pad is in the range of about 30 µm to about 100 µm. The bond pads, again, serve as electrical connection points to the associated electronic circuitry (shown as 46 and 46', which, as in the embodiment of FIG. 2, may be in separate regions of the substrate, as shown, or combined and present in a single region of the substrate) and are thus in electrical communication therewith. Again, there is a trade-off, and it is important that the dark mirror not be so large as to block too large a fraction of the sensor, thereby unnecessarily reducing the amount of light reaching the sensor.

Figure 4:
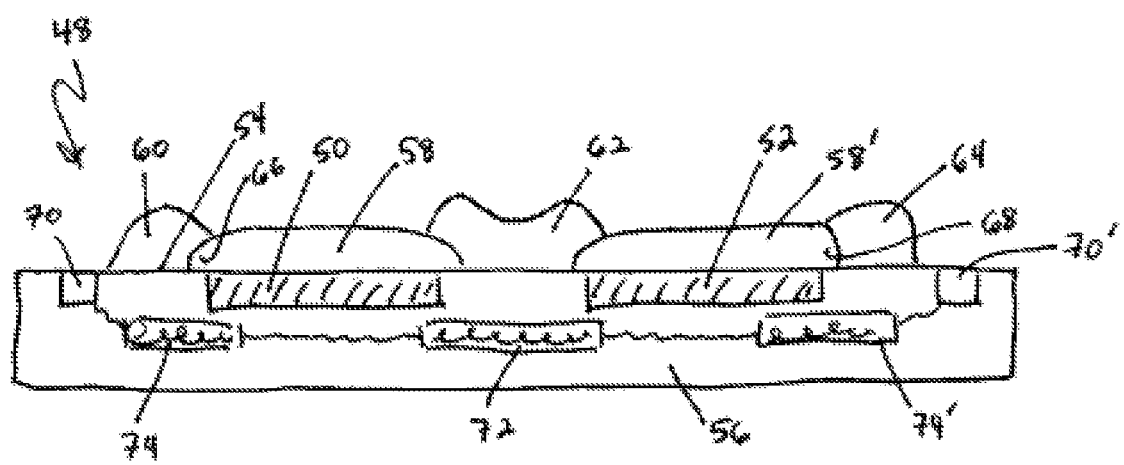
FIG. 4 is a schematic cross-sectional view of an additional embodiment of an optical sensor assembly of the invention, in which a dark mirror coating overlies a substrate in which there are two image sensors.

FIG. 4 illustrates an alternative embodiment of the invention in schematic cross-sectional view. In FIG. 4, optical sensor assembly 48 contains two image sensors, a first image sensor 50 and a second image sensor 52, both positioned in the surface 54 of substrate 56. It will be appreciated that this is a representative embodiment, and that additional alternative embodiments can be envisioned containing three or more image sensors in a substrate surface. Optical thin film filters 58 and 58' cover the surface of first image sensor 50 and second image sensor 52, respectively. Three regions of dark mirror coating are shown at 60, 62, and 64, with coating regions 60 and 64 overlying the substrate surface 54 and extending from each outer tapering region 66 and 68 of the first and second image sensors 50 and 52, respectively, to each bond pad 70 and 70', which, as above, serve as electrical connection points to the associated electronic circuitry (shown as 72, 74, and 74', which, again, may be in separate regions of the substrate, as shown, or combined and present in a single region of the substrate) and are thus in electrical communication therewith.

Figure 5:
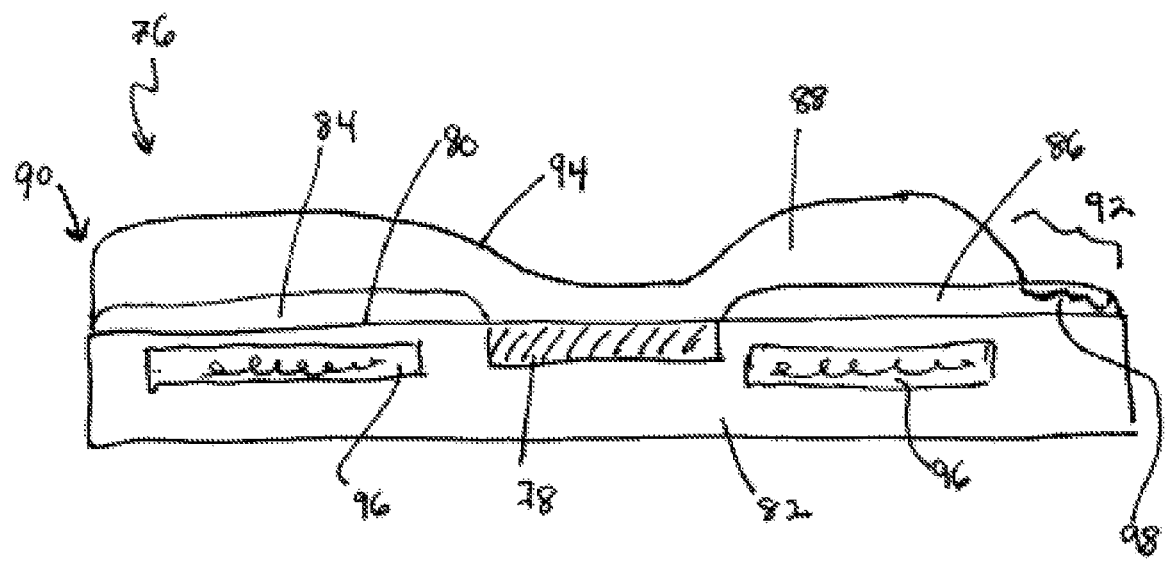
FIG. 5 is a schematic cross-sectional view of an alternative embodiment of an optical sensor assembly of the invention, in which a dark mirror coating overlies non-optically active areas of the substrate surface, and an optical thin film filter is then provided that partially or completely covers the dark mirror-coated regions.

Another embodiment of the invention is illustrated schematically in cross-section in FIG. 5. The optical sensor assembly 76 is shown with a single image sensor 78 positioned centrally in the surface 80 of substrate 82. In this embodiment, the dark mirror coating 84 and 86 are underneath the optical thin film filter 88. The optical filter 88 and dark mirror coating 84 can be coterminal as shown at 90. In this case, the arrangement does not prevent reflection from the thin film filter surface 94, but the dark mirror coating 84 does block light into the substrate 82 and the electronic circuitry 96 contained therein, as well as preventing reflections between the substrate 82 and the dark mirror coating 84. Alternatively, and as shown at 92, the optical thin film filter 88 overlying dark mirror coating 86 may extend only partway across that coating, leaving a region 98 of the dark mirror coating that is exposed as a surface. The inverted embodiment wherein the dark mirror coating is under the optical filter may be advantageously employed when the optical filters are relatively thick. This inverted embodiment may also be advantageously employed when two or more image sensors are present in a single optical sensor assembly and two adjacent sensors are in close proximity, so as to prevent cross-talk between the adjacent sensors.

Figure 6:
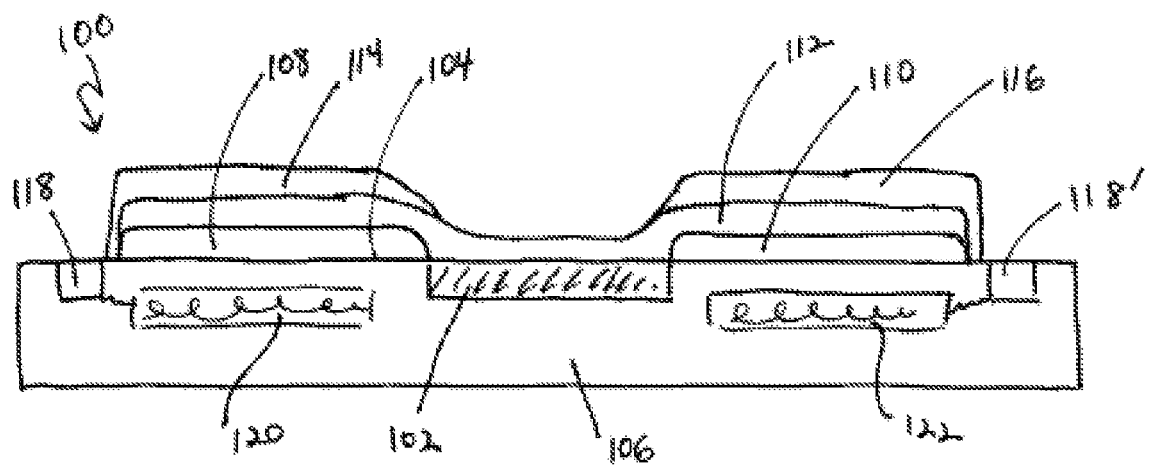
FIG. 6 is a schematic cross-sectional view of an additional alternative embodiment of an optical sensor assembly of the invention, in which a first dark mirror coating is disposed on non-optically active areas of the substrate surface, an optical thin film filter is provided that covers the dark mirror-coated regions as well as the sensor aperture, and a second dark mirror coating overlies the optical thin film filter.

FIG. 6 illustrates an additional embodiment of the invention in schematic cross-sectional view, wherein the dark mirror coating is provided on both sides of an optical thin film filter. The optical sensor assembly is shown generally at 100, with the optical image sensor 102 positioned centrally in the surface 104 of substrate 106. Inner dark mirror coatings 108 and 110 are underneath the optical thin film filter 112 and outer dark mirror coatings 114 and 116 disposed on the opposing side of the filter. The bond pads 118 and 118' again serve as electrical connection points to the associated electronic circuitry (shown as 120 and 122, which, again, may be in separate regions of the substrate, as shown, or combined and present in a single region of the substrate).

In all of the above-described embodiments, it is generally desired to avoid depositing the dark mirror over the electric connection points, sometimes referred to as bond pads, to allow electrical contact to be made at the electrical connection points. As noted earlier herein, the dark mirror coating terminates in the region of the bond pad, but does not cover it. Typically, the dark mirror coating terminates between the edge of the sensor and the bond pad, with a distance between the two in the range of about 30 µm to about 100 µm.

The SEM photos in FIG. 7 illustrate one function of the dark mirror coating herein, in terms of masking surface defects at an edge of the aperture (FIGS. 7B and 7C) and in the tapering region of an optical thin film filter, where the individual layers of the filter become narrower and appear to merge, potentially altering the function of the filter (FIG. 7D). In FIG. 8, the ability of the dark mirror coating to essentially smooth over a physical defect at the opposing aperture edge is shown in the SEM photos of FIGS. 8B and 8C. A tapering region of the dark mirror coating overlying the thin film optical filter may be seen in the SEM photo of FIG. 8D.

A visible dark mirror coating of the invention was prepared using a sputtering deposition technique as described in U.S. Pat. No. 8,163,144. The individual layers of the coating were successively deposited on a fused silica substrate with the following layers, ordered from innermost, i.e., on the substrate, to outermost:

| Layer # | Material | n @ 550 nm | k @ 550 nm | Phys. Th., nm |
|---|---|---|---|---|
| 1 | $Ta_2O_5$ | 2.178 | 0 | 9.2 |
| 2 | $SiO_2$ | 1.475 | 0 | 36.9 |
| 3 | $Ta_2O_5$ | 2.178 | 0 | 45.2 |
| 4 | Ta | 3.227 | 2.927 | 6.9 |
| 5 | $SiO_2$ | 1.475 | 0 | 75.4 |
| 6 | Ta | 3.227 | 2.927 | 7.0 |
| 7 | $SiO_2$ | 1.475 | 0 | 66.7 |
| 8 | Ta | 3.227 | 2.927 | 5.7 |

-continued

| Layer # | Material | n @ 550 nm | k @ 550 nm | Phys. Th., nm |
|---|---|---|---|---|
| 9 | $SiO_2$ | 1.475 | 0 | 148.2 |
| 10 | Ta | 3.227 | 2.927 | 6.2 |
| 11 | $SiO_2$ | 1.475 | 0 | 332.8 |
| 12 | Ta | 3.227 | 2.927 | 9.8 |
| 13 | $SiO_2$ | 1.475 | 0 | 228.3 |
| 14 | Ta | 3.227 | 2.927 | 16.6 |
| 15 | $SiO_2$ | 1.475 | 0 | 81.7 |
| 16 | Ta | 3.227 | 2.927 | 6.2 |
| 17 | $SiO_2$ | 1.475 | 0 | 81.2 |

FIG. 1 is a reflectance spectrum obtained at wavelengths in the range of 300 nm to 800 nm, and indicates the percent reflectance from the coated side of the substrate, the percent reflectance from inside the substrate, and the optical density. The dark mirror coating was found to reduce the level of reflectance from (uncoated) values such as 9%, 23%, or 60% to less than 1%.

It is to be understood that while the invention has been described in conjunction with a number of specific embodiments, the foregoing description is intended to illustrate and not limit the scope of the invention. Other aspects, advantages and modifications will be apparent to those skilled in the art. All patents, patent applications, and publications mentioned here are hereby incorporated by reference in their entireties.

We claim:

1. An optical sensor assembly comprising:
a substrate having a surface;
an optical image sensor positioned in the surface of the substrate;
an optical thin film filter covering the optical image sensor, wherein the optical thin film filter includes terminal tapering regions covering a portion of the surface of the substrate that extends beyond either side of the optical image sensor; and
a dark mirror coating covering a portion of the surface of the substrate and a portion of the optical thin film filter.

2. The optical sensor assembly of claim 1, wherein the dark mirror coating covers a portion of the terminal tapering region of the optical thin film filter.

3. The optical sensor assembly of claim 1, further comprising a bond pad positioned in the surface of the substrate, wherein the dark mirror coating covers a terminal tapering region of the optical thin film filter, and a portion of the surface of the substrate to each bond pad.

4. The optical sensor assembly of claim 3, wherein the dark mirror coating extends a distance from an edge of the optical image sensor to the bond pad.

5. The optical sensor assembly of claim 4, wherein the distance is from about 30 µm to about 100 µm.

6. The optical sensor assembly of claim 1, further comprising electronic circuitry positioned within the substrate.

7. The optical sensor assembly of claim 1, wherein dark mirror coating covers a first terminal tapering region of a first optical thin film filter, a portion of the substrate surface, and a second terminal tapering region of a second optical thin film filter.

8. The optical sensor assembly of claim 1, wherein the dark mirror coating includes an absorbing layer and an outwardly facing dielectric layer.

9. The optical sensor assembly of claim 8, wherein the outwardly facing dielectric layer has a low refractive index.

10. The optical sensor assembly of claim 1, wherein the dark mirror coating includes a first substantially non-absorbing layer, a first absorbing layer, and an outwardly facing dielectric layer.

11. The optical sensor assembly of claim 1, wherein the dark mirror coating is a multilayer structure including an outwardly facing dielectric layer and alternating layers of absorbing layers and non-absorbing layers.

12. An optical sensor assembly comprising:
a substrate having a surface;
an optical image sensor positioned in the surface of the substrate;
a dark mirror coating covering a portion of the surface of the substrate, wherein the dark mirror coating includes at least one absorbing layer of a gray metal or metal alloy and an outwardly facing dielectric layer, wherein the dark mirror coating includes at least one substantially non-absorbing layer comprised of two or more substantially non-absorbing sublayers; and
an optical thin film filter covering the optical image sensor and the dark mirror coating.

13. The optical sensor assembly of claim 12, wherein the optical image sensor is positioned centrally in the surface of the substrate.

14. The optical sensor assembly of claim 12, wherein the dark mirror coating and the optical thin film filter coterminate at a first end of the optical sensor assembly.

15. The optical sensor assembly of claim 12, wherein a portion of the dark mirror coating extends beyond the optical thin film filter leaving an exposed surface portion of the dark mirror coating.

16. The optical sensor assembly of claim 12, wherein the at least one absorbing layer is comprised of two or more absorbing sublayers.

17. The optical sensor assembly of claim 12, wherein the at least one substantially non-absorbing layer is comprised of a dielectric material.

* * * * *